(12) United States Patent
Kaufman

(10) Patent No.: US 10,536,071 B2
(45) Date of Patent: *Jan. 14, 2020

(54) DETECTING GROUND FAULTS ON NON-ISOLATED DC SYSTEMS

(71) Applicant: Pika Energy, Inc., Westbrook, ME (US)

(72) Inventor: Joshua Daniel Kaufman, Gorham, ME (US)

(73) Assignee: Pika Energy, Inc., Westbrook, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/948,396

(22) Filed: Apr. 9, 2018

(65) Prior Publication Data

US 2018/0294712 A1 Oct. 11, 2018

Related U.S. Application Data

(63) Continuation of application No. 15/222,380, filed on Jul. 28, 2016, now Pat. No. 9,966,835.

(60) Provisional application No. 62/198,377, filed on Jul. 29, 2015.

(51) Int. Cl.
*H02M 1/32* (2007.01)
*G01R 31/02* (2006.01)
*H02M 1/00* (2006.01)
*H02M 5/458* (2006.01)

(52) U.S. Cl.
CPC ............ *H02M 1/32* (2013.01); *G01R 31/025* (2013.01); *H02M 5/4585* (2013.01); *H02M 2001/0009* (2013.01)

(58) Field of Classification Search
CPC ............ H02M 1/32; H02M 3/04; H02M 7/04; H02M 2001/0009; G01R 31/02; G01R 31/025
USPC ...................... 363/52, 56.01–56.12, 120, 153
See application file for complete search history.

(56) References Cited

U.S. PATENT DOCUMENTS

| 9,490,738 | B2 * | 11/2016 | Nondahl | ................. H02P 27/08 |
| 9,966,835 | B2 | 5/2018 | Kaufman et al. | |
| 2007/0007929 | A1 * | 1/2007 | Lee | ................... H02M 7/53875 318/802 |

(Continued)

OTHER PUBLICATIONS

"U.S. Appl. No. 15/222,380, Non Final Office Action dated May 19, 2017", 10 pgs.

(Continued)

*Primary Examiner* — Yemane Mehari
(74) *Attorney, Agent, or Firm* — Schwegman Lundberg & Woessner, P.A.

(57) ABSTRACT

A power conversion topology and control method intended for use with a DC bus is disclosed, providing a means to prevent the flow of ground fault current while detecting a fault condition and optionally continuing to operate the DC bus. In one control configuration, a DC-DC power stage with an active current control loop drives differential current to zero, and a separate voltage control loop maintains the desired differential bus voltage. Absolute bus voltage with respect to ground is monitored in order to detect fault conditions. In another configuration, the absolute voltage of the bus with respect to ground is controlled and differential bus current is monitored to detect ground fault conditions.

20 Claims, 2 Drawing Sheets

(56) References Cited

U.S. PATENT DOCUMENTS

| | | | |
|---|---|---|---|
| 2009/0085510 A1* | 4/2009 | Pande | H02M 1/4216 |
| | | | 318/729 |
| 2011/0234126 A1* | 9/2011 | Meyer, III | H02P 29/0241 |
| | | | 318/400.3 |
| 2016/0079888 A1* | 3/2016 | Li | H02P 6/002 |
| | | | 318/400.3 |
| 2016/0248334 A1* | 8/2016 | Patel | H03H 7/06 |
| 2016/0329851 A1* | 11/2016 | Borisov | H02P 21/50 |
| 2017/0033679 A1 | 2/2017 | Kaufman | |

OTHER PUBLICATIONS

"U.S. Appl. No. 15/222,380, Notice of Allowance dated Jan. 3, 2018", 9 pgs.

"U.S. Appl. No. 15/222,380, Response filed Oct. 17, 2017 to Non Final Office Action dated May 19, 2017", 8 pgs.

\* cited by examiner

DETECTING GROUND FAULTS ON NON-ISOLATED DC SYSTEMS

RELATED APPLICATIONS

This application is a continuation of U.S. patent application Ser. No. 15/222,380, filed on Jul. 28, 2016, which claims the benefit of priority to U.S. Provisional Application Ser. No. 62/198,377, filed on Jul. 29, 2015, which applications are incorporated herein by reference.

BACKGROUND

Direct-Current (DC) energy distribution networks are increasingly advantageous given the growth of clean energy technologies including photovoltaic solar, energy storage, microgrids, and high-efficiency DC loads including LED lighting, since these systems are fundamentally DC in nature. One valuable feature of such distribution networks is the ability to detect unwanted leakage of current (i.e. ground faults) that can result in hazards to personnel and equipment. A common method of detecting ground faults involves galvanically isolating the output of a power converter from its input using an isolation transformer, either a low frequency transformer (e.g. 60 Hz) at an AC input or a high-frequency (10-100 kHz) transformer within a DC/DC conversion stage and then allowing that output to float with high impedance to ground and monitoring voltage relative to ground. However, galvanic isolation of converters significantly increases cost and reduces energy transmission efficiency.

SUMMARY

A power conversion topology and control method intended for use with a DC bus is disclosed, providing a means to prevent the flow of ground fault current while detecting a fault condition and optionally continuing to operate the DC bus. In one control configuration, a DC-DC power stage with an active current control loop drives differential current to zero, and a separate voltage control loop maintains the desired differential bus voltage. Absolute bus voltage with respect to ground is monitored in order to detect fault conditions. In another configuration, the absolute voltage of the bus with respect to ground is controlled and differential bus current is monitored to detect ground fault conditions.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms to control the bridges and power sources described herein may be implemented in circuitry or software executing on a specifically programmed computer in one embodiment. The software may consist of computer executable instructions stored on computer readable media or computer readable storage device such as one or more memory or other type of hardware based storage devices, either local or networked. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

Figure 1:
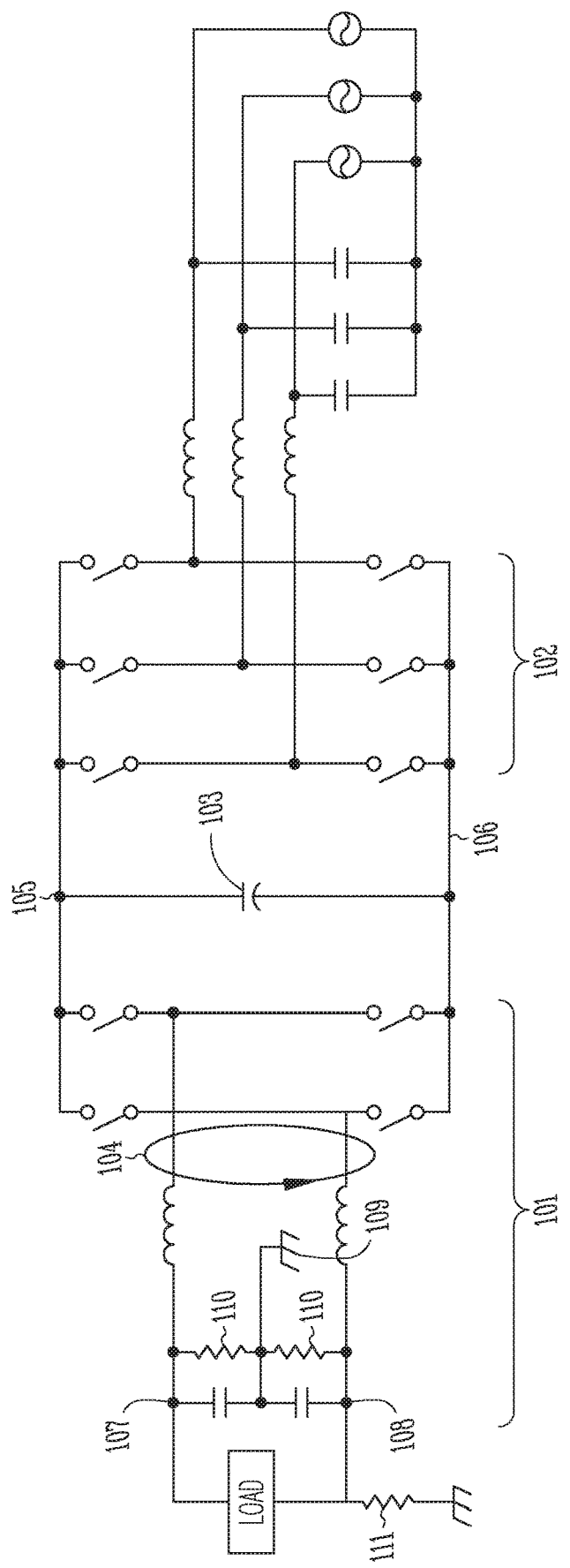
FIG. 1 is a schematic diagram of a non-isolated AC/DC inverter capable of ground fault detection according to an example embodiment.

Referring to FIG. 1, in one embodiment an AC/DC power converter serving a DC energy distribution network such as a DC microgrid is provided, comprising a DC-DC stage 101 and an AC stage 102 joined by an internal DC link capacitance 103. The AC stage comprises two or three half-bridges, each half-bridge driven independently by pulse-width-modulated signals and connected through an output filter to one leg of an AC supply.

The DC-DC stage comprises two half-bridges, each of which is driven independently by pulse-width-modulated signals. A sensitive differential current sensor 104, for instance a residual current detector or an open-frame high-sensitivity current sensor with both DC rails passing through the opening in opposite directions, detects net flows of current.

The DC output bus comprises positive rail 107 and negative rail 108 configured to operate at nominally equal and opposite voltages with respect to earth ground. The voltages of the DC output rails are measured with respect to earth ground at point 109. High-impedance grounding resistors 110 stabilize the absolute bus voltage about earth ground in the absence of leakage current.

The sensitivity of differential sensor 104 may be selected to achieve ground fault detection at the desired current level. In typical embodiments a sensitivity level of a few milliamps will be adequate. The offset error of the current sensor is balanced by the high-impedance grounding resistors. A higher offset current requires lower resistance balancing resistors at the expense of extra power loss. Typically these resistors would have values ranging from a few tens of kilo-ohms up to 1 mega-ohm.

Two operational modes are appropriate depending on the application objectives. In both modes the AC power stage 102 is operated to maintain the internal DC voltage consisting of positive rail 105 and negative rail 106. The DC power stage 101 is controlled with two control variables, the duty cycle for the pulse width modulation of each half bridge. Depending on the operational mode, the two input variables necessary to generate commands for those two control variables are either differential DC bus voltage (i.e. the potential between points 107 & 108) and differential current 104 or alternatively differential DC bus voltage and absolute bus voltage with respect to ground.

In the first operational mode, the differential bus current is driven to zero. In the event of a ground fault, for example a resistive short 111 on the negative rail, a tiny amount of current will flow through the fault path, but the current loop will counteract this flow by driving the voltage of the negative rail to earth potential. Meanwhile the voltage loop will maintain the bus voltage at the desired differential value. The voltage imbalance of the DC link is detected and used to signal a ground fault. The output can be shut down automatically, or alternatively the bus can operate safely in the imbalanced state until the fault is corrected—this may be especially valuable in critical applications demanding high reliability and resilience.

In this approach, any offset in the differential current sensor's measurement will be balanced by the balancing resistors 110. The bus imbalance will be the offset current times one half of the balance resistance. Reducing this offset requires reducing the balance resistor resistance, leading to additional power loss.

In the second operational mode, differential ground current is measured, but not driven to zero. As long as the ground current remains within the safe operating bounds, typically tens of milliamps, the output DC bus voltage is controlled to be symmetrical with respect to earth ground. If the differential current gets out of these safe bounds, the bus voltage is allowed to float away from earth ground to maintain a safely low level of ground fault current. This approach has the advantage of lower power loss in the balancing resistors with the tradeoff that some small level of ground fault current is ignored.

In operation, a voltage control loop drives the two or three bridges of the AC power stage 102 collectively to achieve the desired voltage as measured across the internal DC rails 105 & 106. If the AC power stage is operated to maintain each rail of the internal DC link at a voltage somewhat exceeding the desired differential voltage of the DC bus, then ground fault current during a ground fault event will be practically zero. If the internal bus is operated at a lower voltage than the differential output DC voltage, then some momentary ground fault current will result until the internal bus equalizes with the newly-shifted output bus.

Figure 2:
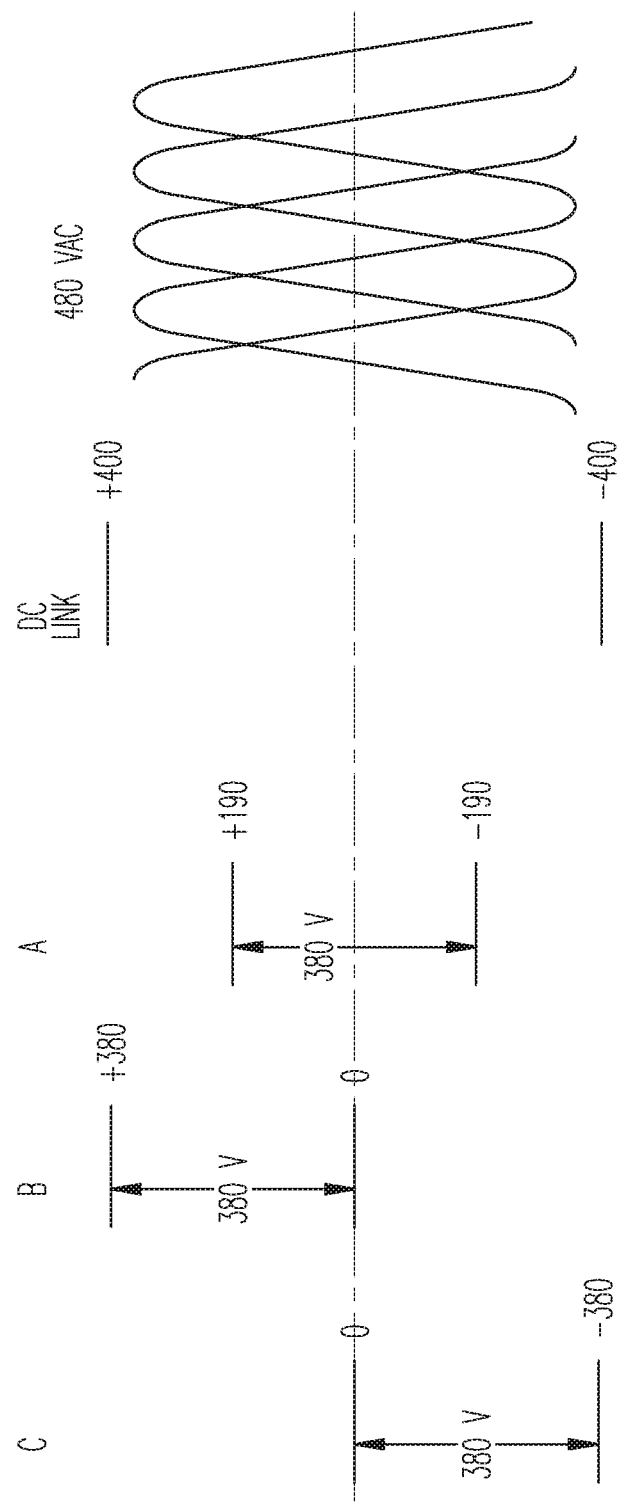
FIG. 2 is a voltage diagram of a power converter in its normal mode of operation and in two different ground-faulted modes according to an example embodiment.

Referring to FIG. 2, in normal operation the converter operates between an AC supply (such as 480V three-phase AC or 240V split-phase AC) and a DC supply, such as a split-rail DC microgrid operating at +/−190V (380V differential). In normal operation, each side of the DC-DC stage operates at a boost/buck ratio of approximately 2:1, and the DC output is in balance with the internal DC link. In the event of a ground fault on the positive rail, the DC output swings low, such that 'positive' rail has zero potential relative to ground, and the negative rail operates at −380V. Conversely, in the event of a ground fault on the negative rail, the DC output swings high, such that the positive rail operates at +380V. Because the voltage of each rail of the DC link exceeds the differential voltage of the output, the DC/DC converter can operate normally across the full voltage swing necessary to tolerate ground faults on either rail.

It can be seen with reference to FIGS. 1 and 2 that the circuit of FIG. 1 achieves the same protection against the flow of ground fault current as an isolated converter, without the cost and efficiency loss associated with galvanic isolation.

Other types of converter topologies can achieve the same result as long as the internal bus voltage is allowed to swing to + and − of the differential output DC voltage and the current differential (ground fault current) is controlled.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. A method of detecting ground fault currents comprising:
   providing a DC bus where ground fault currents are to be detected, the rails of the DC bus being tied to ground through a high impedance;
   providing a power converter capable of independently driving each rail of the DC bus from an AC source;
   controlling an absolute voltage of the DC bus with respect to ground; and
   monitoring differential bus current to detect ground fault conditions.

2. The method of claim 1 where the voltage of the source exceeds the voltage of the DC bus.

3. The method of claim 1 where the voltage of the source is at least two times the voltage of the DC bus.

4. A method of detecting ground fault currents in a DC bus having rails tied to ground through a high impedance, the method comprising:
   independently driving each rail of the DC bus from an AC source;
   controlling an absolute voltage of the DC bus with respect to ground; and
   monitoring differential bus current to detect ground fault conditions.

5. A DC-DC power stage comprising:
   means for controlling the absolute voltage of a DC bus with respect to ground; and
   means to monitor differential bus current on DC rails of the DC bus to detect ground fault conditions.

6. The DC-DC power stage of claim 5 and further comprising grounding resistors to stabilize the absolute bus voltage about earth ground in the absence of leakage current.

7. The DC-DC power stage of claim 5 wherein the means to monitor differential bus current comprises a differential current sensor having a sensitivity of a few milliamps.

8. The DC-DC power stage of claim 5 wherein the means to monitor differential bus current comprises a residual current sensor.

9. The DC-DC power stage of claim 5 wherein the means to monitor differential bus current comprises an open-frame high-sensitivity current sensor having an opening.

10. The DC-DC power stage of claim 5 wherein both DC rails pass through the opening in opposite directions.

11. A circuit comprising:
   an AC stage having a plurality of half bridges driven independently by pulse-width-modulated signals to couple to an AC source of power;
   a DC-DC stage having a plurality of half bridges driven independently by pulse-width-modulated signals, the AC and DC-DC stages coupled via an internal DC link capacitor coupled between internal DC rails;
   a DC output stage having a positive rail and a negative rail coupled to ground via high-impedance grounding resistors, the rails coupled to respective half bridges of the DC-DC stage to receive positive and negative DC voltages respectively; and
   a differential sensor coupled to the DC output stage positive and negative rails to measure a difference in current, wherein an absolute voltage of the DC bus is controlled with respect to ground.

12. An AC to DC power converter comprising:
- an AC stage having multiple half-bridges disposed between shared internal rails to couple to corresponding multiple legs of an AC supply;
- an internal DC stage joined to the AC stage by an internal DC link capacitor coupled between the shared internal rails, the internal DC stage having two half-bridges coupled between the shared internal rails;
- an output DC stage having output rails coupled to respective half-bridges of the internal DC stage via an output filter; and
- a current sensor coupled to detect a difference in current between the output rails, wherein an absolute voltage of the DC bus is controlled with respect to ground.

13. The AC to DC power converter of claim 12 and further comprising grounding resistors coupled between each output rail and earth ground.

14. The AC to DC power converter of claim 13 wherein the grounding resistors have high impedances to stabilize the absolute bus voltage about earth ground in the absence of leakage current.

15. The AC to DC power converter of claim 12 wherein the current sensors is a differential current sensor having a sensitivity of a few milliamps.

16. The AC to DC power converter of claim 12 current sensor is a residual current sensor.

17. The AC to DC power converter of claim 12 wherein the current sensor comprises an open-frame high-sensitivity current sensor having an opening.

18. The AC to DC power converter of claim 17 wherein the output rails pass through the opening in opposite directions.

19. An AC to DC power converter comprising:
- a pair of internal DC bus rails;
- a plurality of buck/boost converters, one for each phase of an AC supply, disposed between the internal DC bus rails;
- a pair of output DC bus rails coupled to the internal DC bus rails;
- a voltage detector coupled to detect a voltage across each of the output DC bus rails with respect to ground; and
- a current sensor coupled to detect a difference in current between the output DC bus rails, wherein an absolute voltage of the output DC bus rails is controlled with respect to ground.

20. The power converter of claim 19 and further comprising:
- a controller including an active current control loop that drives differential current on the pair of internal DC bus rails to zero; and
- a separate voltage control loop that maintains a specified differential bus voltage.

* * * * *

UNITED STATES PATENT AND TRADEMARK OFFICE
CERTIFICATE OF CORRECTION

PATENT NO. : 10,536,071 B2
APPLICATION NO. : 15/948396
DATED : January 14, 2020
INVENTOR(S) : Joshua Daniel Kaufman It is certified that error appears in the above-identified patent and that said Letters Patent is hereby corrected as shown below:

In the Claims

In Column 4, Line 10, in Claim 1, delete "he" and insert --be-- therefor

Signed and Sealed this
Fifth Day of May, 2020

Andrei Iancu
*Director of the United States Patent and Trademark Office*